United States Patent [19]

Cai

[11] Patent Number: 4,825,234
[45] Date of Patent: Apr. 25, 1989

[54] CYLINDRICAL ALL AROUND STEREOPHOTOGRAPH (PHOTO-STATUE) AND A CYLINDRICAL CONTINUOUS PHOTOGRAPHY WITH LENTICULE AND ITS EQUIPMENT

[76] Inventor: Hong-Zhang Cai, No. 2 Branch Lane 43 Lane 1088 Yu Yuan Rd., Shanghai, China

[21] Appl. No.: 857,272

[22] Filed: Apr. 30, 1986

[30] Foreign Application Priority Data

Jun. 20, 1985 [CN] China ................................. 85104886

[51] Int. Cl.⁴ ................................................ G03B 35/00
[52] U.S. Cl. ..................................... 354/112; 354/115; 40/454; 350/130
[58] Field of Search ............... 354/112, 114, 115, 116, 354/121; 355/22; 352/58, 81, 84; 353/7; 40/427, 454, 554, 19; 350/130, 131

[56] References Cited

U.S. PATENT DOCUMENTS

| | | | |
|---|---|---|---|
| 966,342 | 8/1910 | Madler | 352/101 |
| 2,505,469 | 4/1950 | Gerardin | 352/84 |
| 2,668,473 | 2/1954 | Brixner | 352/84 |
| 2,853,918 | 9/1958 | Yolee | 352/84 |
| 2,968,990 | 1/1961 | Buck et al. | 352/84 |
| 3,460,563 | 8/1969 | Bresin et al. | |
| 3,564,988 | 2/1971 | Jones | 354/115 |
| 3,686,781 | 8/1972 | Calhoun | 40/454 |
| 3,895,867 | 7/1975 | Lo et al. | 355/77 |
| 4,037,950 | 7/1977 | Lo et al. | 352/58 |
| 4,109,261 | 8/1978 | Law | 354/112 |
| 4,109,262 | 8/1978 | Law | 354/112 |
| 4,125,849 | 11/1978 | Law | 354/112 |
| 4,158,487 | 6/1979 | Collender | 352/58 |

FOREIGN PATENT DOCUMENTS

| | | | |
|---|---|---|---|
| 2486258 | 1/1982 | France | |
| 45-23512 | 7/1970 | Japan | 354/115 |
| 1471100 | 4/1977 | United Kingdom | |
| 1471819 | 4/1977 | United Kingdom | |

*Primary Examiner*—A. A. Mathews
*Attorney, Agent, or Firm*—Pennie & Edmonds

[57] ABSTRACT

The present invention relates to stereophotography for a cylindrical all around stereophotograph, lenticular cylindrical continuous photography, and associated apparatus. A new type of cylindrical negative film stand is to be used in connection with a new lenticular image formation continuous displacement photographing method. A stereophotograph on which a stereo-image may be sighted at any angle of the object being photographed is obtainable. The method is also capable of use to record a change in scenery on a negative film during a time duration.

9 Claims, 1 Drawing Sheet

U.S. Patent    Apr. 25, 1989    4,825,234
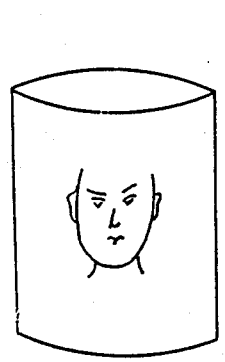
Fig 1A
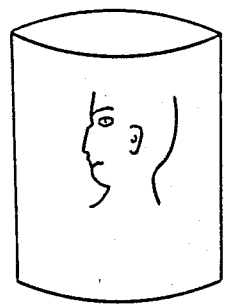
Fig 1B
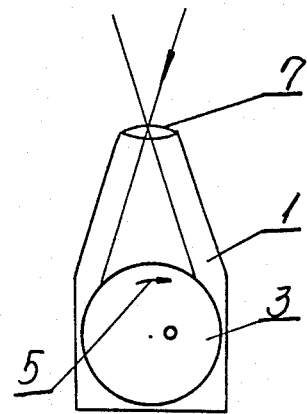
Fig 2
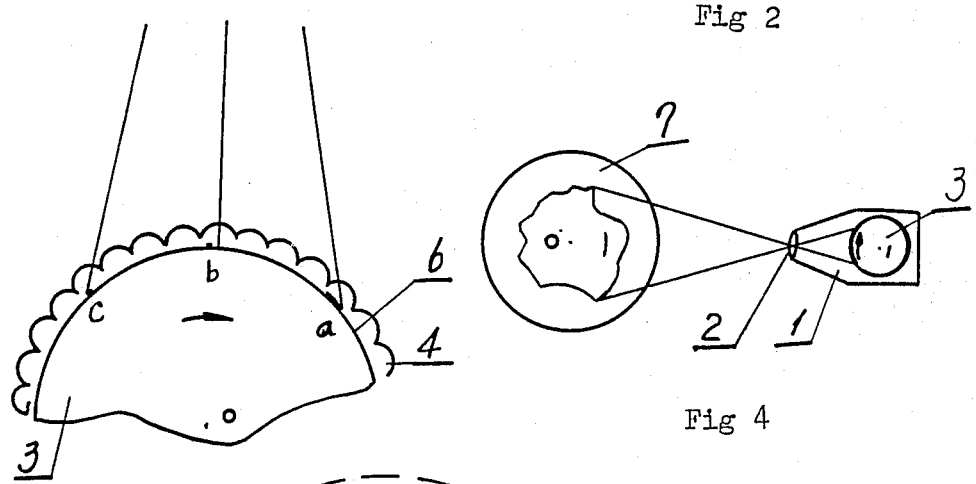
Fig 3
Fig 4
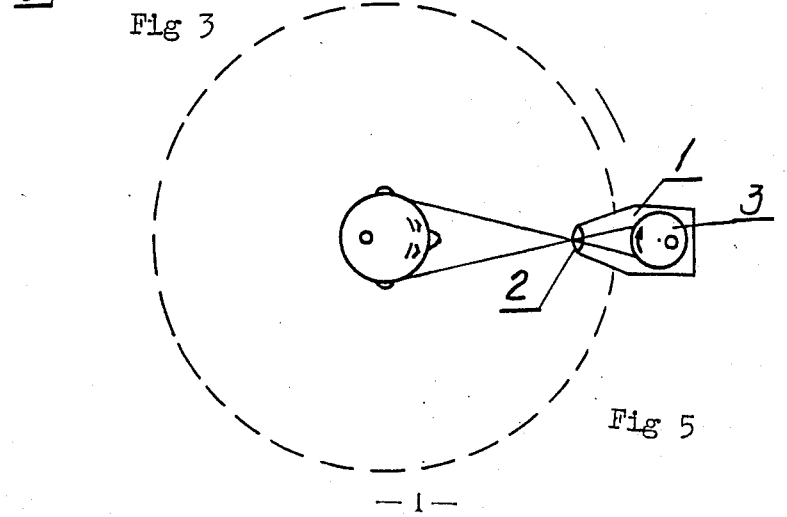
Fig 5
— 1 —

CYLINDRICAL ALL AROUND STEREOPHOTOGRAPH (PHOTO-STATUE) AND A CYLINDRICAL CONTINUOUS PHOTOGRAPHY WITH LENTICULE AND ITS EQUIPMENT

FIELD OF THE INVENTION

The present invention relates to a cylindrical all around stereophotograph, or so-called "photostatue", a cylindrical continuous photography with lenticule and associated apparatus.

DESCRIPTION OF THE PRIOR ART

Lenticular photography used in high speed photography and stereophotography is called the "streak method" in applied optics. By means of a lenticule several images can be recorded on one negative film and reproduced to turn out a stereoscope picture. However, before the present invention, the picture which is a planar stereograph has only been able to record the front view of an object confronting the camera. The back and side views, in other words an all around view, could not be reproduced in one stereoscope picture.

SUMMARY OF THE INVENTION

The present invention makes use of the principles of the lenticular process in photography and a new photographic technique which makes it possible to take a photograph of an object with 360° all around images. In such photography, the stereo-image of the object at any angular position at which it may be sighted is the same as that of a view of a statue. The new technique also makes it possible to record a constant change of scenery on one negative film. The film, in turn, may be printed into photographs in order to display the entire change of the scenery throughout a time interval.

The principles of the lenticular process to take a planar stereograph are known. According to a feature of the present invention, in taking a stereophotograph, the negative film on which the presentation of an object to be photographed at any angle around a full 360° turn is located in cylindrical form and then covered with a lenticular screen.

A cylindrical stereophotograph is an essential development out of the planar stereograph, and it provides advantages not inherent in the planar stereograph to further improve the functioning of the lenticule. Since the cylindrical stereophotograph is cylindrical in form, one and only one view under the cover of the lenticule should reach the vision of the viewer at any one sight location. In this way the number of photographs to be taken on the cylindrical negative film may be increased, with an increase, also, in the images around the object to be photographed and recorded, respectively. All stereophotographs may be sighted one by one through rotation, and uninterrupted viewing may be possible by virtue of the stereophotograph being cylindrical in form. When viewing the stereograph with both eyes, the angle of vision of each eye is different so that two pictures at different positions may be sighted simultaneously. This manner of sighting results in a sensation of a stereoscopic effect.

A cylindrical stereophotograph is particularly suitable in the documentary recording of an object, such as a figure or thing around a full 360° turn. The cylindrical stereophotograph is also applicable for taking serial photographs of an object in motion and to monitor the process of change in an object or in scenery.

The lenticular all around camera for taking a cylindrical stereophotograph differs from a camera which may be considered conventional in that it incorporates a cylindrical stand upon which a negative film may be loaded and a lenticular screen to cover the film. In operation, the cylindrical stand, while the photographing process is carried out, turns about its own axis at a uniform angular speed.

DETAILED DESCRIPTION OF THE INVENTION

The photography carried out with the all around camera 1 follows a new technique called "cylindrical continuous photography with lenticule". The fundamental principle of the new technique, in the application of the lenticular streak method is that only one bundle of parallel rays for exposure is obtained for taking a single picture occupying a single strip or streak of the cylindrical negative film comprising the exposure region confronting the camera lens 2. The next picture is taken when the cylindrical stand 3 has turned through a small angle and a non-exposed lenticular strip is located within the exposure region. Thus, for each exposure a non-exposed lenticular strip locates to the exposure region and the lenticular strip just exposed moves with the cylindrical stand out of the exposure region.

The exposed streak should have a slight displacement angularly with respect to the next streak for exposure since there is a slight angular displacement with the optical axis of the lens after each lenticule is turned through one streak. Strips of the negative film to be exposed and covered with the lenticular screen 4 enter the exposure region one by one as the cylindrical stand turns in the direction of arrow 5, see, for example, FIG. 2, through repeated small angles until the entire film is exposed. The exposure process is continuous during rotation of the cylindrical stand at a uniform angular speed of movement. There is no, relative motion between the lenticular screen and the film 6. This process may proceed without interruption under circumstances that it is possible to reload the film without interruption. The present invention makes use of a cylindrical stand to mount negative film to take a photograph in continuous exposure since the lenticule as it moves with the negative film produces a linear displacement for image formation. In this way it is possible to carry out continuous and substantially endless photography. The new technique in photography is unprecedented.

Aside from a stand for a camera other accessories, such as a synchronizing mechanism for rotation of the object and image are necessary. The synchronizing mechanism may be one or the other of two types. Thus, the synchronizing mechanism may be of the type characterized by a fixed camera with both the object and image in synchronous rotation. This type of synchronizing mechanism is suitable to photograph common objects, such as a work of art of the like. The main component of the accessory is a rotary table 7 for the object. This rotary table rotates at a speed of rotation synchronized with the speed of rotation of the cylindrical stand for negative film in the camera. Particularly, the angular speeds of the rotary table and the cylindrical stand are the same. Photography is carried out once the object is placed at the center of the rotary table, and the camera, fixed at some distance from the object, is focused on the object. During photography, the rotary table and the cylindrical stand rotate and rotation is accompanied by opening and closing of the shutter (not shown, but conventional). One revolution of the rotary table will complete an all around photograph. The synchronizing mechanism may also be of the type wherein the camera revolves around the object while the object and image are in synchronous rotation. This type of synchronizing mechanism is suitable for photographing a human figure. The main component of the accessory is a pivoted bracket upon which the camera is fixed and set to revolve around the object. The cylindrical stand moves at the same angular speed under control of a transmission system. The human figure is located at a position at the center of rotation of the camera, and the process is completed upon one complete revolution of the camera around the figure.

Other photographs of this type may be taken. To this end, it is possible to use a lenticule to photograph and record a portrait of a human figure photographed at various attitudes by single, multiple or continuous exposure methods on the cylindrical negative film, followed by printing the negative into photographs under the cover of lenticule. Lenticular cylindrical continuous photograph with a fundamental construction of camera may be extended in application to a photography process, such as motion picture photography and high speed photography to record a change in scenery, and to print cartoons, respectively.

The advantages of the present invention may be apparent. Thus, the invention may be utilized with simple photographic equipment and techniques to record an all around, fully 360°, view of a human figure or object, record a change of scenery, and to produce a simple photograph for viewing. Prior to the advent of photography a drawing was used to record a scene at some specific time. In a similar way, a statute was created to record a full figure. Since the advent of photography, one has been provided with a simpler and more scientific means to record a scene, for example, yet no method has been available to record a full figure. Accordingly, the present invention seeks to make use of techniques of photography in creating a new field of photography so as to record the image of a figure or thing as a whole, both simply and scientifically.

DESCRIPTION OF THE DRAWING

FIGS. 1A and 1B are schematic diagrams of a cylindrical all around stereophotograph.

FIG. 2 is a schematic diagram of a lenticular all around camera with a cylindrical film support.

FIG. 3 is an enlarged schematic diagram of an exposure procedure for film on the film support of FIG. 2 covered with a lenticular screen.

FIG. 4 is a schematic diagram of a method of photography with the camera fixed and the object and image moving rotationally in synchronism.

FIG. 5 is a schematic diagram of a method of photography with the camera movable in rotation around the object and the object and image moving rotationally in synchronism.

Referring to the drawing, FIG. 1A is a front view of a cylindrical all around stereophotograph, and FIG. 1B is a view of FIG. 1A as seen following rotation through an angle of 90°. The cylindrical stereophotograph has a cylindrical shape, and the photograph taken by lenticular continuous photography is made in cylindrical form and covered with a lenticular screen. The photograph may be either of transparent or non-transparent character.

FIG. 2 illustrates a lenticular all around camera having a cylindrical negative film stand. The film stand is adapted to rotate in synchronism with a rotary table or with the pivoted bracket. These adaptations wherein the rotary table and pivoted bracket rotate at the same angular speed as that of the film stand are illustrated in FIGS. 4 and 5.

FIG. 3 illustrates a portion of the negative film, including streaks a, b and c of a lenticular screen. The negative film covered by a streak or strip a has already been exposed, and the streak is about to leave the exposure region. The streak b, the strip in the middle, is under an intermediate exposure, while streak c is about to enter the exposure region to undergo exposure. Movement of the film stand is illustrated by the arrow.

FIG. 4 is a schematic diagram of one method of photography. According to this method the camera is fixed with the object and image rotating in synchronism. Particularly, a rotary table with the object placed along its axis rotates at the same angular speed as that of the cylindrical film stand in the camera. Drive to the film stand and rotary table may be through a common transmission system.

FIG. 5 illustrates the object type camera rotating about the object with both the object and image rotating at relative, synchronous speed. The object may be a figure located at the pivot position, and the camera is adapted to revolve around the object at an angular speed which is the same as that of the speed of rotation of film stand in the camera.

What is claimed is:

1. A cylindrical all around stereophotograph formed by a lenticular technique characterized in that said photograph is recorded with images of an object being photographed representing an all around (360°) view and made from a negative positioned on a circular curved surface covered with a lenticular screen.

2. The stereophotograph according to claim 1 further characterized in that said circular curved surface includes a part of a cylindrical surface.

3. The stereophotograph according to claim 1 further characterized in that the photograph is one of a transparency and non-transparency.

4. A lenticular all around camera for stereophotography comprising a camera body and lens and characterized by a lenticular cylindrical negative stand, a lenticular screen surrounding said cylindrical negative stand, means locating said negative stand along the axis of said lens, and means supporting said negative stand in the camera body for rotation.

5. The camera of claim 4 further comprising means for synchronizing rotation of said stand with the views of an object during relative movement of both said object and camera.

6. A system including the camera of claim 4, a table for support of an object, a bracket, means for supporting said bracket for movement about the axis of said table and object, said camera located to said bracket in position that the axis of said lens passes through the axis of said table, and a transmission system, said transmission system connected to said bracket and stand to move both components in a rotary, synchronous path of movement as said camera moves about said object.

7. A method of taking a continuous photograph related to stereophotography comprising providing a cylindrical film stand, mounting a negative film fully about said stand, mounting a lenticular screen over said negative film and maintaining said screen is the mounted position relative to said film, and rotating said stand at a uniform, angular speed of motion while photographing continuously the cylindrical all around view of said object.

8. The method of claim 7 further including maintaining said camera fixed and rotating said stand and object synchronously at said uniform, angular speed of motion 9. The method of claim 7 further including maintaining said object fixed and rotating said stand as said camera moves synchronously about said object.

* * * * *

UNITED STATES PATENT AND TRADEMARK OFFICE
CERTIFICATE OF CORRECTION

PATENT NO. : 4,825,234

DATED : April 25, 1989

INVENTOR(S) : Hong-Zhang Cai

It is certified that error appears in the above-identified patent and that said Letters Patent is hereby corrected as shown below:

In the drawings:

Numeral 7 of Fig. 2 should have been changed to number 2; In Fig. 5, the line adjacent the dashed circle should be replaced with an arrow as shown on the attached sheet.

Signed and Sealed this

Fifth Day of March, 1991

*Attest:*

HARRY F. MANBECK, JR.

*Attesting Officer*  *Commissioner of Patents and Trademarks*

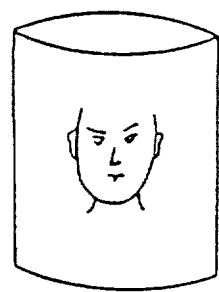
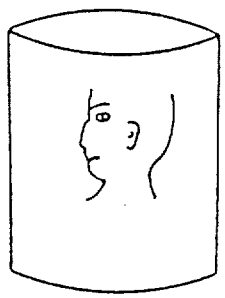
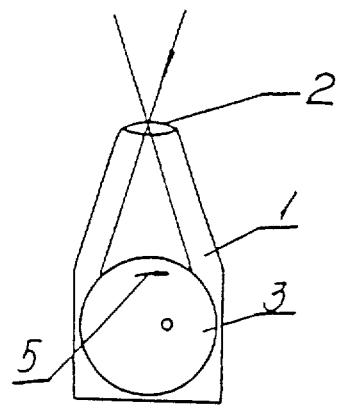
Fig 1A          Fig 1B          Fig 2
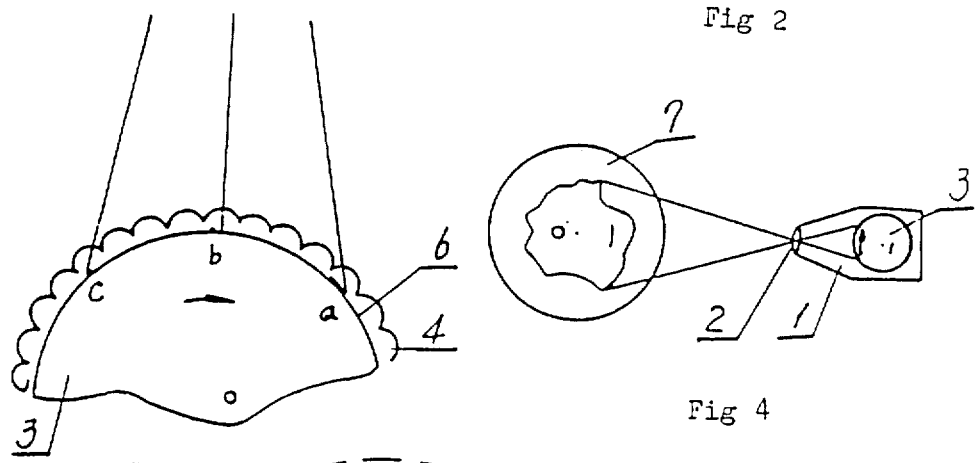
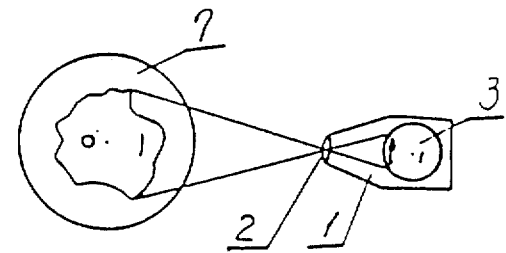
Fig 3          Fig 4
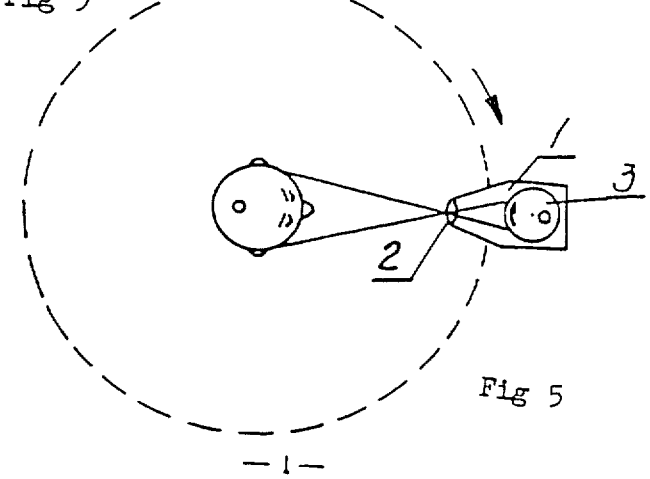
Fig 5